United States Patent
Trenner et al.

(10) Patent No.: US 8,253,042 B2
(45) Date of Patent: Aug. 28, 2012

(54) HOUSING COMPRISING AN ELECTRONIC COMPONENT

(75) Inventors: Uwe Trenner, Nürnberg (DE); Matthias Wieczorek, Neunkirchen a. Sand (DE); Jürgen Henniger, Erlangen (DE); Helmut Karrer, Fürth (DE); Alexander Wenk, Burgoberach (DE); Roland Falkner, Schnaittach (DE); Joachim Buhl, Nürnberg (DE)

(73) Assignee: Conti Temic microelectronic GmbH (DE)

( * ) Notice: Subject to any disclaimer, the term of this patent is extended or adjusted under 35 U.S.C. 154(b) by 234 days.

(21) Appl. No.: 12/531,624

(22) PCT Filed: Feb. 23, 2008

(86) PCT No.: PCT/DE2008/000317
§ 371 (c)(1),
(2), (4) Date: Mar. 30, 2010

(87) PCT Pub. No.: WO2008/113315
PCT Pub. Date: Sep. 25, 2008

(65) Prior Publication Data
US 2010/0187007 A1    Jul. 29, 2010

(30) Foreign Application Priority Data
Mar. 19, 2007  (DE) .......................... 10 2007 013 695
Jun. 14, 2007  (DE) .......................... 10 2007 027 334

(51) Int. Cl.
*H01R 13/502*  (2006.01)

(52) U.S. Cl. ........................................ 174/562; 257/704
(58) Field of Classification Search .................. 174/520, 174/562; 257/704
See application file for complete search history.

(56) References Cited

U.S. PATENT DOCUMENTS

| | | | |
|---|---|---|---|
| 4,390,220 A * | 6/1983 | Benasutti | 439/71 |
| 5,850,104 A * | 12/1998 | Avis | 257/726 |
| 6,570,089 B1 * | 5/2003 | Mc Grew et al. | 174/50 |
| 6,703,560 B2 * | 3/2004 | Coico et al. | 174/535 |
| 6,861,292 B2 * | 3/2005 | Chiu | 438/121 |
| 6,891,730 B2 * | 5/2005 | Farassat | 361/769 |
| 6,936,501 B1 * | 8/2005 | Too et al. | 438/122 |
| 6,979,782 B1 * | 12/2005 | Brodsky et al. | 174/535 |
| 7,253,515 B2 * | 8/2007 | Horie et al. | 257/704 |
| 7,733,655 B2 * | 6/2010 | Beaumier et al. | 361/719 |
| 2002/0053453 A1 * | 5/2002 | Farnworth et al. | 174/52.1 |
| 2007/0284144 A1 * | 12/2007 | Too et al. | 174/520 |

FOREIGN PATENT DOCUMENTS

| DE | 74 17 008 U | 9/1974 |
|---|---|---|
| DE | 101 31 431 C1 | 2/2003 |
| EP | 1 286 393 | 2/2003 |
| JP | 2003 174269 A | 6/2003 |

* cited by examiner

*Primary Examiner* — Hung Ngo
(74) *Attorney, Agent, or Firm* — RatnerPrestia

(57) ABSTRACT

An arrangement of an electronic component in a plastic housing, including a cover and a lower part, and to a method for fixing the electronic component in the housing. The cover is connected to the lower part and exerts a pre-defined force (F) on the electronic component. The cover is designed such that the influence of the height tolerance (dh) of the electronic component on the force (F) can be compensated to the effect that, once the cover has been mounted, the force (F) applied to the lower part is in a pre-defined force range (B).

16 Claims, 2 Drawing Sheets

HOUSING COMPRISING AN ELECTRONIC COMPONENT

CROSS REFERENCE TO RELATED APPLICATIONS

This application is the U.S. national phase application of PCT International Application No. PCT/DE2008/000317, filed Feb. 23, 2008, which claims priority to German Patent Application No. DE102007013695.3, filed Mar. 19, 2007 and German Patent Application No. DE102007027334.9, filed Jun. 14, 2007, the contents of such applications being incorporated by reference herein.

BACKGROUND OF THE INVENTION

1. Field of the Invention

The invention relates to an arrangement of an electronic component in a housing, the housing and a method for fixing the electronic component in the housing.

2. Description of the Related Art

Electronic components, in particular sensors, are used in the field of measurement technology, general control technology and also in particular in automotive technology. The electronic components work in the environment of aggressive media, such transmission oils and are exposed to high temperature fluctuations and high mechanical loads. They detect inter alia variables such as pressures, speeds and distances. For this purpose, it is usually required that the position of the electronic component to the part to be sensed is exactly adjusted and also maintained over the entire life. Beyond that, a certain force for fixing the electronic component in its retainer may not be exceeded, since it is often pressure-sensitive and can damaged in case of too high acting forces. Therefore, the dimensions of the electronic components must observe close tolerances, since for example in case of an oversize the electronic component would have to be pressed into the retainer and could be damaged.

So far, electronic components have usually been mounted into a injection molding blank serving as a retainer, the injection molding blank has been placed into an injection mold and then injection of the component housing has been finished in a further stage. This includes many manufacturing steps and besides requires relative high material expenditure.

SUMMARY OF THE INVENTION

It is an object of at least one aspect of the invention to arrange an electronic component in a housing of the type mentioned above such that the electronic component functions according to its specification over the entire life, wherein the electronic component may be afflicted with certain size tolerances.

The cover of the housing is designed such that the influence of a height tolerance of the electronic component on the force, which the cover in the mounted state exerts, is compensated to the effect that the applied force is in a pre-defined force range, in particular does not exceed a certain maximum force. Thus, while maintaining the functionality of the electronic component over the entire life the manufacturing costs for the electronic component are reduced.

It is a further object of at least one aspect of the invention to create a housing, which is suitable to safely position and fix an electronic component with certain size tolerances with simple means over its entire life.

Advantageously, the force, which the cover exerts on the electronic component, may range between a minimum force, which is at least necessary to fix the electronic component in the housing, and a maximum force, which may not be exceeded to secure the functionality of the electronic component.

The compensation of the height tolerance may be given by means of a pre-defined elasticity modulus of the cover or by means of a pre-defined thickness profile of the cover. A combination of both features would also be conceivable. The cover, usually also the housing, is preferably made of polyamide or another polymer. The elasticity modulus of the cover lies in particular in the range between 3 GPa and 10 Gpa. The thickness of the cover varies advantageously between 0.15 mm and 3.0 mm. It would be also possible that the cover thickness has a profile tapering from the center outwards, or vice versa.

The cover can be formed in particular plane-parallel, piano-convex or also concave-convex. An advantage of a form of the cover which is curved in direction to the electronic component is that this attains an additional prestress.

The cover may comprise a depression, which serves as a predetermined extension point.

The connection between the cover and the lower part of the housing can be produced for example by screwing, welding, gluing or caulking.

It is a further object of one or more aspect of the invention to create a method which is suitable to safely position and fix an electronic component with certain size tolerances in a housing also over a long period of time.

With the method for fixing the electronic component in the housing at first the electronic component is placed into the lower part of the housing. Then, the cover is placed on the lower part, advantageously a pre-defined force being exerted in controlled manner on the cover. The influence of a height tolerance of the electronic component on the force is compensated by the nature of the cover such that the applied force is in a force range and does not exceed above all a pre-defined maximum force. The force range lies in particular between a minimum force, which is at least necessary to fix in the housing, and a maximum force, which may not be exceeded to secure the functionality of the electronic component. The connection between the cover and the lower part of the housing can be produced for the example by screwing, welding, gluing or caulking.

Preferably, the cover can be heated before placing it on the lower part. Heating can be effected partially or over the whole surface of the cover. Here, the temperature gradient over the thickness of the cover must not be homogeneous. When heating the cover the limit temperature to plastic deformation should not be exceeded. By the heating the material of the cover softens and presses an electronic component, whose height lies at the upper tolerance, with a reduced force into the housing lower part and thus prevents that the electronic component is damaged.

BRIEF DESCRIPTION OF THE DRAWINGS

Further advantages and features of the invention will become apparent from the ensuing description of an example of embodiment on the basis of the drawing, in which.

DETAILED DESCRIPTION OF THE PREFERRED EMBODIMENTS

Figure 1:
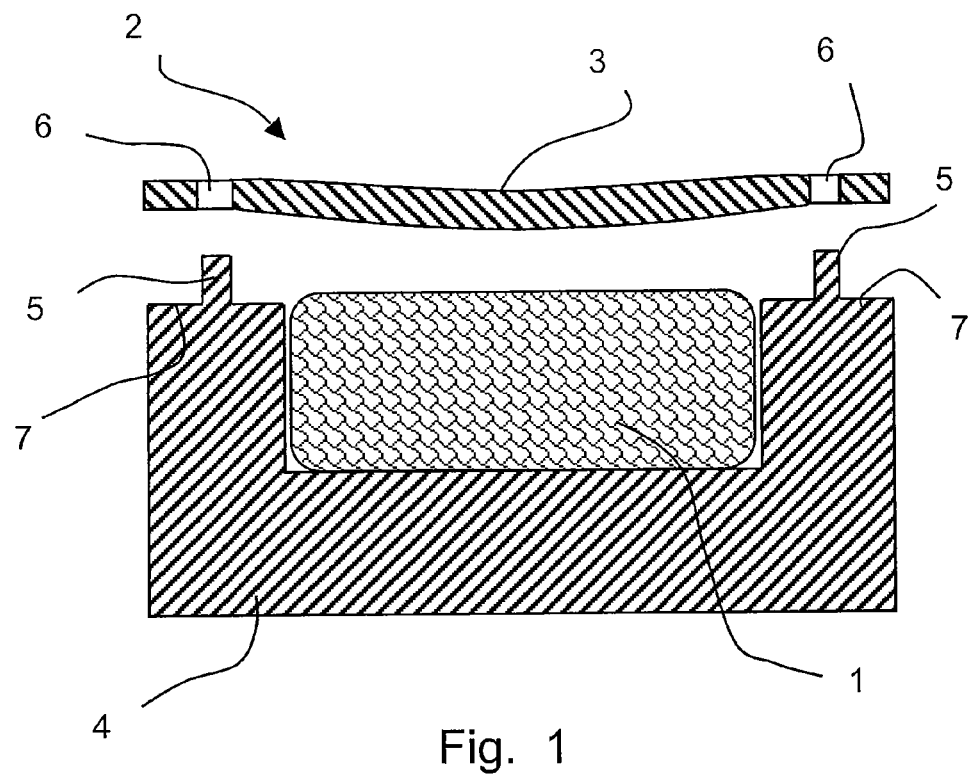
FIG. 1 shows an electronic component in a housing with the cover before the assembly.

FIG. 1 shows a sensor 1 as an example for an electronic component in the lower part 4 of a housing 2, the cover 3 of the housing 2 not yet being mounted. The sensor 1 protrudes over the edge 7 of the lower part 4. Thus, the height measurement of the sensor 1 lies at the upper tolerance size. At the edge 7 of the lower part 4 at least two in particular cylindrical pins 5 are arranged. The cover 3 has a concave-convex profile, the convex portion of the cover 3 showing towards the sensor 1. The outer portion of the cover 3 are at least two openings 6, which are provided to accommodate the pins 7.

Figure 2:
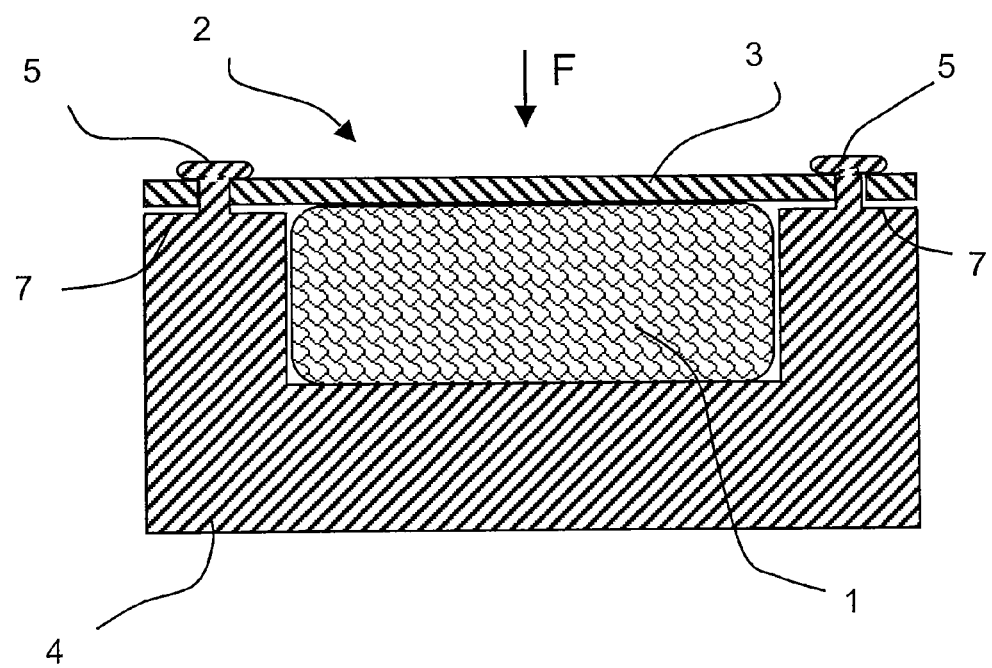
FIG. 2 shows a housing as in FIG. 1, with a mounted cover.

FIG. 2 shows the sensor 1 in the housing 2 with a mounted cover 3. Preferably, the connection between the cover 3 and the lower part 4 of the housing 2 is sealing against the external environment. The pins 5 are arranged and caulked in the corresponding openings 6 of the cover 3. The cover 3 has deformed by the assembly. The formerly concave-convex profile is now plane-parallel. The cover acts like a spring. Thus, the difference of the force F on the sensor 1 depending on the height tolerance of the sensor 1 turns out to be small when the cover 3 is mounted. If the cover 3 is mounted force-monitored, a higher prestress on the sensor 1 is achieved. This counteracts a weakening of the force F by age-related relaxing of the cover material.

The profile of the cover could also be plano-convex, plane-parallel or meniscus-shaped. The resilient effect of the cover is then achieved by the geometry of the cover 3. As an alternative, the resilient effect can also be achieved by the selection of the elasticity modulus of the cover material. A combination of suitable cover geometry and suitable cover material would also be conceivable.

Figure 3:
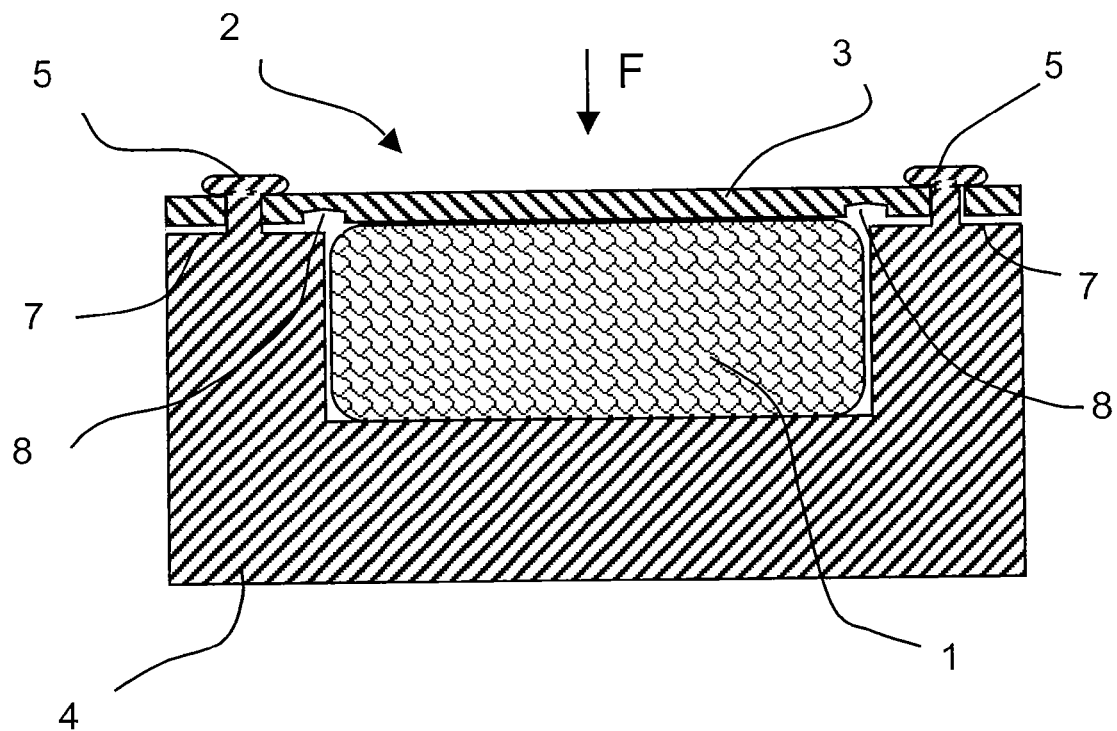
FIG. 3 shows a housing as in FIG. 2, with circumferential depression in the cover.

FIG. 3 shows the housing 2 as in FIG. 2 with a circumferential depression 8 in the surface, facing the sensor, of the cover 3. In particular the depression 8 runs essentially the sensor 1 and the pin 5. However, form and position of the depression 8 can also vary. Thus, the cover 3 can also comprise one or several linear, preferably parallel running depressions 8. Also a u-shaped running depression 8 would be conceivable. The depression 8 can be also arranged on the surface, facing way from the sensor 1, of the cover 3.

Figure 4:
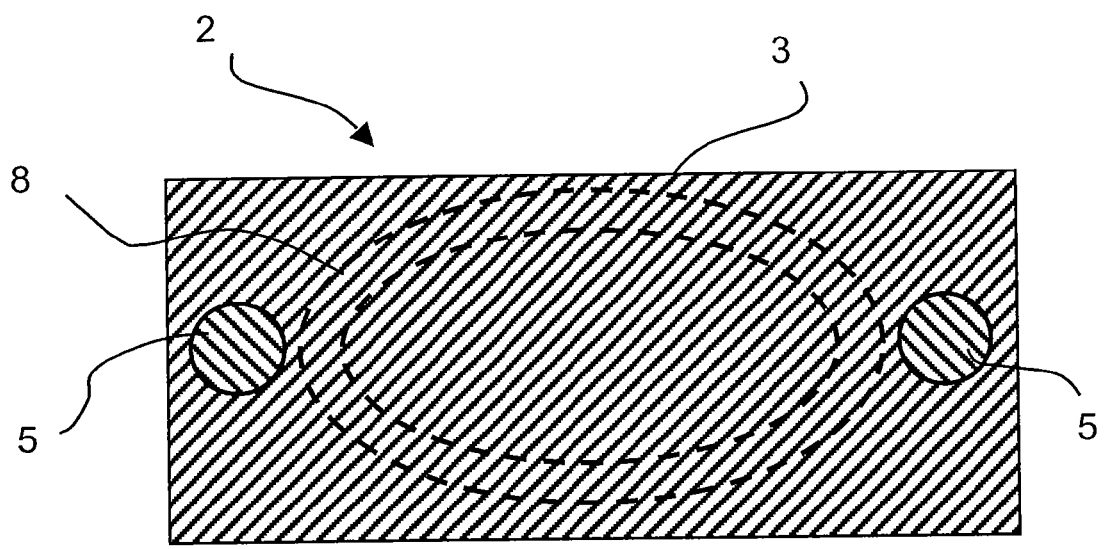
FIG. 4 shows a housing as in FIG. 3, top view.

FIG. 4 shows the housing 2 as in FIG. 3 top view.

A further possibility not shown to limit the force F to a pre-defined force range B is to heat at least partially the cover 3 before the assembly. Here, the cover 3 can also be a standard cover without large requirements to the material or the geometry. Advantageously, by the soft cover 3 the force F distributes uniformly over the sensor 1. In particular, a positive-fit fixing of the sensor 1 is possible by the cover 3. Another advantage of this form of embodiment is that the cover 3 can be mounted with stop, i.e. that the cover 3 in the mounted state rests upon the edge 7 of the lower part 4. An expensive monitoring of the force will not apply when the heated cover 3 is mounted.

The present invention was shown on the basis of the foregoing description as to explain the principle of the invention and its practical application in best possible way. However, with a suitable modification, the invention can be realized naturally in numerous other forms of embodiment.

The invention claimed is:

1. An arrangement of an electronic component in a plastic housing, comprising:
    a unitary cover having a continuous mounting surface; and
    a lower part defining a planar surface and a recess formed in the planar surface in which the electronic component is positioned such that a top surface of the electronic component resides at an elevation directly above the planar surface of the lower part,
    wherein the mounting surface of the cover is connected to the planar surface of the lower part and the mounting surface of the cover contacts the top surface of the electronic component and exerts a pre-defined force (F) on the top surface of the electronic component,
    wherein the cover is designed such that the influence of a height tolerance (dh) of the electronic component on the applied force (F) is compensated to the effect that the applied force (F) is in a pre-defined force range (B).

2. A housing according to claim 1, wherein the pre-defined force range (B) lies between a minimum force (Fmin), which is at least necessary to fix the electronic component in the housing, and a maximum force (Fmax), which is to be maintained to secure the functionality of the electronic component.

3. A housing according to claim 1, wherein the compensation of the height tolerance (dh) is a function of a pre-defined elasticity modulus (E) of the cover and/or by a pre-defined profile of the thickness (D) of the cover.

4. A housing according to claim 1, wherein the cover is essentially formed plane-parallel.

5. A housing according to claim 1, wherein the cover is formed plano-convex.

6. A housing according to claim 1, wherein the cover is formed concave-convex.

7. A housing according to claim 1, wherein the cover comprises at least one depression that is formed on the mounting surface of the cover which faces the top surface of the electronic component, wherein, upon mounting the cover on the electronic component, the cover flexes at the depression to accommodate the electronic component.

8. A housing according to claim 1, wherein the cover is connected to the lower part by means of screwing, welding, gluing or caulking.

9. A housing according to claim 7, wherein the depression is a channel that is formed on the mounting surface of the cover.

10. A housing according to claim 9, wherein the channel substantially surrounds the electronic component upon assembling the cover to the lower part.

11. A housing according to claim 9, wherein the channel has an oval shape.

12. A housing according to claim 11, wherein the oval shaped channel has a U-shaped cross-section.

13. A housing according to claim 9, further comprising a fastener for connecting the cover to the lower part, wherein the channel is at least partially positioned between the fastener and the electronic component upon fastening the cover to the lower part.

14. A method for fixing an electronic component in a plastic housing, comprising a unitary cover defining a continuous mounting surface and a lower part defining a planar surface and a recess formed in the planar surface, wherein an applied force (F) that the cover exerts onto the electronic component once the cover has been mounted is influenced by the following steps:

placing the electronic component into the recess of the lower part such that a top surface of the electronic component resides at an elevation directly above the planar surface of the lower part, placing the mounting surface of the cover onto both the planar surface of the lower part and the top surface of the electronic component, and producing a connection between the cover and the lower part such that the influence of a height tolerance (dh) of the electronic component on the applied force (F) is compensated by the cover such that the applied force (F) is in a force range (B).

15. A method for fixing an electronic component according to claim 14 further comprising the step of heating the cover prior to placing the cover on the lower part.

16. A method for fixing an electronic component according to claim 14, wherein the connection between the cover and the lower part is produced by means of screwing, welding, gluing or caulking.

* * * * *